(12) United States Patent
Hooper et al.

(10) Patent No.: US 7,115,167 B2
(45) Date of Patent: Oct. 3, 2006

(54) METHOD OF GROWING A SEMICONDUCTOR MULTI-LAYER STRUCTURE

(75) Inventors: Stewart Edward Hooper, Kidlington Oxon (GB); Jennifer Mary Barnes, Hampton (GB); Valerie Bousquet, Oxford (GB); Jonathan Heffernan, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 403 days.

(21) Appl. No.: 10/079,269

(22) Filed: Feb. 19, 2002

(65) Prior Publication Data

US 2002/0117103 A1 Aug. 29, 2002

(30) Foreign Application Priority Data

Feb. 23, 2001 (GB) ............................................. 0104598

(51) Int. Cl.
*C30B 25/04* (2006.01)

(52) U.S. Cl. ...................... 117/105; 117/106; 117/107; 117/954; 117/952

(58) Field of Classification Search ................ 117/105, 117/106, 107, 954, 952
See application file for complete search history.

(56) References Cited

U.S. PATENT DOCUMENTS

| | | | | |
|---|---|---|---|---|
| 5,602,418 A | | 2/1997 | Imai et al. .................. 257/627 |
| 5,652,437 A | * | 7/1997 | Harris .......................... 257/77 |
| 5,998,810 A | | 12/1999 | Hatano et al. |
| 6,046,465 A | * | 4/2000 | Wang et al. .................. 257/98 |
| 6,515,313 B1 | * | 2/2003 | Ibbetson et al. ............. 257/101 |
| 6,534,797 B1 | * | 3/2003 | Edmond et al. .............. 257/97 |
| 6,541,797 B1 | * | 4/2003 | Udagawa ..................... 257/94 |

OTHER PUBLICATIONS

Hezrog, W.D. et al., *Photoluminescence Microscopy of InGaN Quantum Wells*, Applied Physics Letters, American Insititute of Physics, vol. 70, No. 11, Mar. 17, 1997, pp. 1333–1335.

European Search Report for corresponding EP App. No. 02251250.3, dated Aug. 13, 2004.

* cited by examiner

*Primary Examiner*—Robert Kunemund
(74) *Attorney, Agent, or Firm*—Renner, Otto, Boisselle & Sklar, LLP

(57) ABSTRACT

The invention provides a method of growing an (In, Ga)N multiplayer structure by molecular beam epitaxy. Each GaN or InGaN layer in the multilayer structure is grown at a substrate temperature of at least 650° C., and this provides improved material quality. Ammonia gas is used as the source of nitrogen for the growth process. Ammonia and gallium are supplied to the growth chamber at substantially constant rates, and the supply rate of indium to the growth chamber is varied to select the desired composition for the layer being grown. This allows the structure to be grown at a substantially constant growth rate. The substrate temperature is preferably kept constant during the growth process, to avoid the need to interrupt the growth process to vary the substrate temperature between the growth of one layer and the growth of another layer.

18 Claims, 6 Drawing Sheets

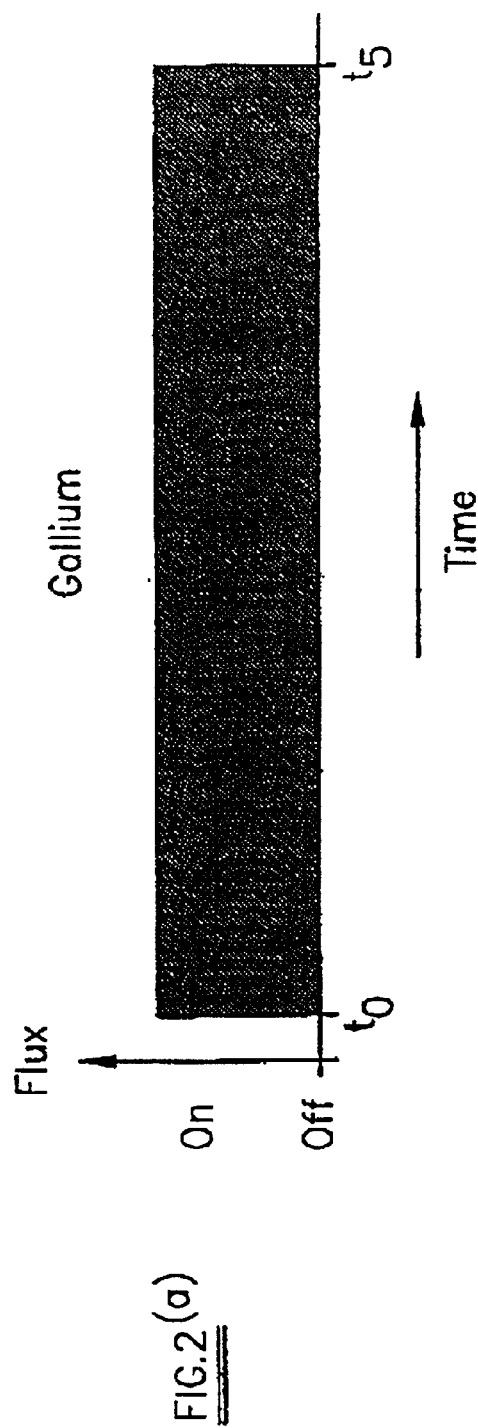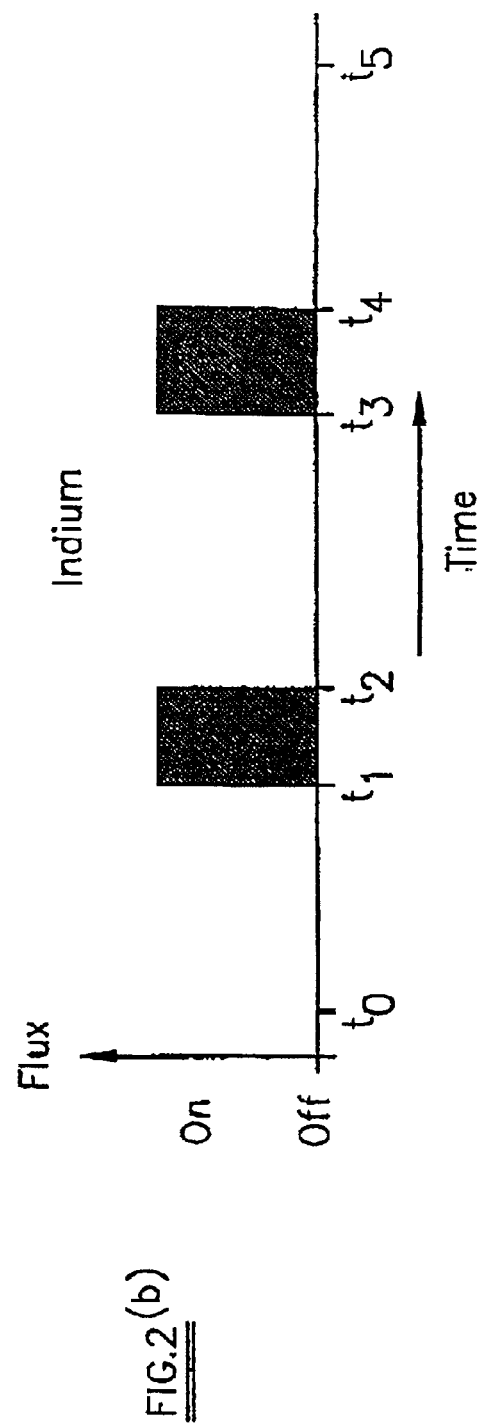
FIG.2(a)
FIG.2(b)

US 7,115,167 B2

METHOD OF GROWING A SEMICONDUCTOR MULTI-LAYER STRUCTURE

BACKGROUND OF THE INVENTION

1. Field of the Invention

This invention relates to a molecular beam epitaxy (MBE) method for the epitaxial growth of Group III nitride semiconductor materials, in particular for the epitaxial growth of an (In,Ga)N quantum well structure or multiple quantum well structure.

2. Description of The Related Art

The $In_xGa_{1-x}N$ ($0 \leq x \leq 1$) material family will be referred to herein as "(In,Ga)N" for convenience. The term "InGaN" will be used to denote a member of the (In,Ga)N family having an indium mole fraction that is non-zero, but that is less than one.

The epitaxial growth of Group III nitride semiconductor materials on a substrate can be effected by molecular beam epitaxy (MBE) or by chemical vapour deposition (CVD) which is sometimes known as Vapour Phase Epitaxy (VPE).

CVD (or VPE) takes place in an apparatus which is commonly at atmospheric pressure but sometimes at a slightly reduced pressure of typically about 10 kPa. Ammonia and the species providing one or more Group III elements to be used in epitaxial growth are supplied substantially parallel to the surface of a substrate upon which epitaxial growth is to take place, thus forming a boundary layer adjacent to and flowing across the substrate surface. It is in this gaseous boundary layer that decomposition to form nitrogen and the other elements to be epitaxially deposited takes place so that the epitaxial growth is driven by gas phase equilibria.

In contrast to CVD, MBE is carried out in a high vacuum environment. In the case of MBE as applied to the (In,Ga)N system, an ultra-high vacuum (UHV) environment, typically around $1 \times 10^{-3}$ Pa, is used. A nitrogen precursor is supplied to the MBE chamber by means of a supply conduit and species providing gallium and/or indium, and possibly also a suitable dopant species, are supplied from appropriate sources within heated effusion cells fitted with controllable shutters to control the amounts of the species supplied into the MBE chamber during the epitaxial growth period. The shutter-control outlets from the effusion cells and the nitrogen supply conduit face the surface of the substrate upon which epitaxial growth is to take place. The nitrogen precursor and the species supplied from the effusion cells travel across the MBE chamber and reach the substrate where epitaxial growth takes place in a manner which is driven by the deposition kinetics.

At present, the majority of growth of high quality nitride semiconductor layers is carried out using the metal-organic chemical vapour deposition (MOCVD) process. The MOCVD process allows growth to occur at a V/III ratio well in excess of 1000:1. The V/III ratio is the molar ratio of the group V element to the Group III element during the growth process. A high V/III ratio is preferable, since this allows a higher substrate temperature to be used which in turn leads to a higher quality semiconductor layer.

At present, growing high quality nitride semiconductor layers by MBE Is more difficult than growing such layers by MOCVD. The principal difficulty is in supplying sufficient nitrogen during the growth process, and it is difficult to obtain a V/III ratio of 10:1 or greater during MBE growth of a nitride semiconductor layer. The two commonly used sources of nitrogen in the MBE growth of nitride layers are plasma excited molecular nitrogen or ammonia.

One particular application of InGaN layers is in the manufacture of light-emitting diodes and laser diodes that emit light in the blue-green region of the spectrum. Light-emitting diodes and laser diodes that emit in this spectral range can be fabricated using layer structures of group III-nitride semiconductors, as disclosed by S. Nakamura and G. Fasol in "The Blue Laser Diode", Springer-Verlag (1997). (In,Ga)N quantum well structures are an essential component in the active region of these light-emitting diodes and laser diodes.

The (In,Ga)N quantum well structures in commercially available light-emitting diodes or laser diodes that emit in the blue-green region of the spectrum are grown using the MOCVD growth technique. The commercial growth of such laser diodes or light-emitting diodes by MOCVD has been reported by Nakamura and Fasol (above), and by S. Keller et al in "Applied Physics Letters" Vol. 68, p3147 (1996).

There have been some reports of the successful MBE growth of (In,Ga)N quantum well structures. For example, the growth of InGaN quantum well structures by MBE at a growth temperature of 670° C. has been reported by H. Riechert at al in "Proceedings of International Conference and Nitride Semiconductors", Tokushina, Japan (1997), and by W. D Herzog et al in "Applied Physics Letters" Vol 70, p1333 (1997). In both these reports, a plasma source was used to generate the activated nitrogen necessary for the growth process.

N. Grandjean et al have reported, In "Applied Physics Letters" Vol. 74 p3616 (1999), the MBE growth of (In,Ga)N multiple quantum well structures using ammonia as the source of nitrogen. However, this growth process was carried out at a low growth temperature, in the range 570 to 620° C. A low growth temperature was obtained because the flux of ammonia to the growth chamber was low, leading to a low V/III ratio.

As a consequence of the low growth temperature, the quality of the InGaN layers grown by these prior art MBE methods is much lower than the quality of InGaN layers grown by MOCVD.

U.S. Pat. No. 5,602,418 discloses a method of growing a multi-crystalline layer on a substrate, so as to allow a single crystal layer that is not lattice matched to the substrate to be grown over the multi-crystalline layer. It does not address the subsequent growth of further layers over the single crystal layer. The method is described for a number of material systems, including the growth of an InGaN layer over an R-face sapphire substrate. U.S. Pat. No. 5,602,418 refers to a growth temperature of 700° C. for an InGaN single crystal layer, but gives no directions as to how such a growth temperature could be achieved,

SUMMARY OF THE INVENTION

A first aspect of the present invention provides a method of growing an (In,Ga)N layer structure by molecular beam epitaxy, the method comprising the steps of: (a) disposing a substrate in a growth chamber; (b) growing a first (In,Ga)N layer having a first indium mole fraction over the substrate at a substrate temperature of at least 650° C.; and (c) varying the rate of supply of indium to the growth chamber thereby to grow a second (In,Ga)N layer having a second indium mole fraction different from the first Indium mole fraction over the first (In,Ga)N layer at a substrate temperature of at least 650° C.; wherein the rates of supply of ammonia and gallium to the growth chamber are kept substantially constant during the growth of the first and second layers.

The growth rate of an (In,Ga)N layer is, at low rates of supply of indium (corresponding to a mole function of In of up to approximately 0.2), determined primarily by the rate of supply of gallium. Maintaining a substantially constant supply rate of gallium over the growth of the first and second (In,Ga)N layers therefore ensures that the growth rate of the first (In,Ga)N layer is substantially equal to the growth rate of the second (In,Ga)N layer, and this improves the growth quality of the layer structure.

The method of the present invention uses ammonia gas as the source of nitrogen required for the growth process, and this is more convenient than having to provide a plasma source. The method produces an (In,Ga)N structure having higher quality than a layer grown by, for example, the method of Grandjean et al, because it uses a higher growth temperature.

The method may comprise the further step of (d) varying the rate of supply of indium to the growth chamber thereby to grow a third (In,Ga)N layer having a third indium mole fraction different from the second indium mole fraction over the second layer at a substrate temperature of at least 650° C.

The method may comprise the further steps of: (e) varying the rate of supply of indium to the growth chamber thereby to grow a fourth (InGaN) layer having the second indium mole fraction over the third layer at a substrate temperature of at least 650° C.; and (f) varying the rate of supply of indium to the growth chamber thereby to grow a fifth (In,Ga)N layer having the third indium mole fraction over the fourth layer at a substrate temperature of at least 650° C.

The rate of supply of gallium and ammonia are kept substantially constant over the growth of the third (In,Ga)N layer, and are also kept substantially constant over the growth of the fourth and fifth (In,Ga)N layers if these are provided. Since the supply rate of gallium is kept substantially constant over the entire growth process all layers of the structure are grown at the same growth rate.

The substrate temperature during the growth of the InGaN layer may be in the range 650° to 800° C. As the substrate temperatures increases indium tends to desorb from a newly-grown InGaN layer, and it is necessary to increase the pressure in the growth chamber to prevent desorption of indium. For substrate temperatures significantly greater than 800° C. the pressure required in the growth chamber becomes so high that the growth conditions are closer to MOCVD growth conditions than to MBE growth conditions, and the growth process effectively ceases to be an MBE growth process. It is therefore preferable to use a substrate temperature below 800° C.

The molecular ratio of the flow rate of ammonia to the growth chamber to the flow rate of indium and gallium to the growth chamber may be selected to be at least 10:1. The growth temperature, and the quality of the layers, would below for a V:III ratio below 10:1. The molecular ratio of the flow rate of ammonia to the growth chamber to the flow rate of indium and gallium to the growth chamber may be selected to be at least 500:1.

The molecular ratio of the flow rate of ammonia to the growth chamber to the flow rate of indium and gallium to the growth chamber may be selected to be less than 10,000:1. For values of the ratio that are significantly greater than 10,000:1 the gas pressure required in the growth chamber again becomes so high that the growth conditions are closer to MOCVD growth conditions than to MBE growth conditions, and the growth process effectively ceases to be an MBE growth process.

The beam equivalent pressure of ammonia supplied to the growth chamber may be greater than $1 \times 10^{-4}$ mbar. For a beam equivalent pressure of ammonia equal to or less than $1 \times 10^{-4}$ mbar the growth rate would be very low, and high-quality growth of the layers could not be reliably obtained.

The beam equivalent pressure of ammonia supplied to the growth chamber may be equal to or less than $2 \times 10^{-2}$ mbar. For values of the beam equivalent pressure of ammonia that are significantly greater than $2 \times 10^{-2}$ mbar the gas pressure required in the growth chamber again becomes so high that the growth conditions are closer to MOCVD growth conditions then to MBE growth conditions, and the growth process effectively ceases to be an MBE growth process.

The beam equivalent pressure of indium and gallium supplied to the growth chamber may be equal to or greater than $1 \times 10^{-8}$ mbar. For a beam equivalent pressure of indium and gallium less than $1 \times 10^{-8}$ mbar the growth rate would be very low, and high-quality growth of the layers could not be reliably obtained.

The beam equivalent pressure of indium and gallium supplied to the growth chamber may be less than $1 \times 10^{-4}$ mbar. For values of the beam equivalent pressure of ammonia that are significantly greater than $1 \times 10^{-4}$ mbar the gas pressure required in the growth chamber again becomes so high that the growth conditions are closer to MOCVD growth conditions than to MBE growth conditions, and the growth process effectively ceases to be an MBE growth process.

The second indium mole fraction may be greater than the first indium mole fraction.

The first indium mole fraction may be zero whereby the first (In,Ga)N layer may be a GaN layer.

The third indium mole fraction layer may be approximately 0.05.

The second indium mole fraction may be approximately 0.2.

Each layer may be grown at substantially the same substrate temperature. This eliminates the interruptions in the growth process that would be required if the substrate temperature had to be changed between the growth of one (In,Ga)N layer and a subsequent (In,Ga)N layer, and so improves the quality of the layers.

A second aspect of the present invention provides an (In,Ga) N layer structure grown by a method as defined above.

An (In,Ga)N layer structure of the invention may be incorporated in, for example, an (In,Ga)N laser diode or in an (In,Ga)N light-emitting diode.

BRIEF DESCRIPTION OF THE DRAWINGS

Preferred embodiment of the present invention will now be described by way of illustrative example with reference to the accompanying figures in which:

FIG. 2(a) and FIG. 2(b) are schematic illustrations of the flow rate of gallium and indium for growth of the (In,Ga)N multiple quantum well structure of FIG. 1 according to one embodiment of the present invention;

DESCRIPTION OF THE PREFERRED EMBODIMENTS

Figure 1:
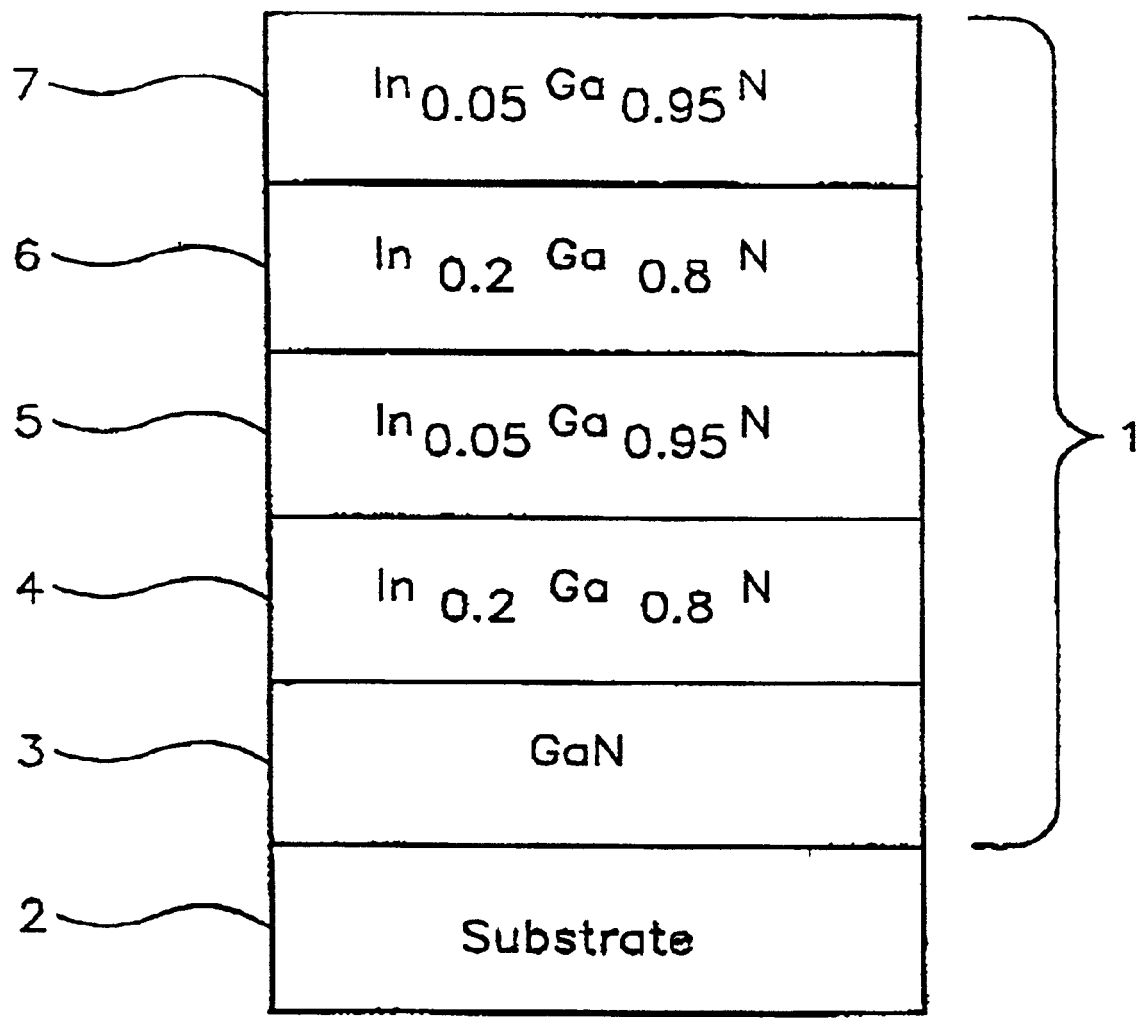
FIG. 1 is a schematic cross-section through an (In,Ga)N multiple quantum well structure.

FIG. 1 is a schematic cross-section of a typical InGaN layer structure 1. The structure consists of a plurality of (In,Ga)N semiconductor layers (five are shown in the example of FIG. 1) grown on a substrate 2. The (In,Ga)N layers 3–7 have different indium mole fractions, so that the forbidden bandgap varies between the layers. The indium content of the layers varies so that a layer with a high indium mole fraction is disposed between two layers having lower indium mole fractions, and vice-versa. As a result, the (In,Ga)N layer structure of FIG. 1 contains quantum wells, which are formed by an (In,Ga)N layer with a low bandgap sandwiched between two (In,Ga)N layer with a higher bandgap. The structure of FIG. 1 is therefore known as a multiple quantum well structure.

In the embodiment of FIG. 1, the second and fourth (In,Ga)N layers 4, 6 have a higher indium mole fraction than the first, third and fifth layers 3, 5, 7. The second and fourth (In,Ga)N layers 4, 6 will be referred to as "indium-rich layers", for convenience.

In the (In,Ga)N layer structure of FIG. 1, the indium-rich layers 4, 6 have an indium mole fraction of 0.2. In the quantum well structure of FIG. 1 the first (In,Ga)N layer 3 has an indium content of zero and so is a GaN layer, and the third and fifth (In,Ga)N layers 5,7 have an indium mole fraction of 0.05. The layer structure is not limited to these specific values of indium content, however. For example, the third and fifth (In,Ga)N layers 5, 7 could alternatively have an indium content of zero and so be GaN layers. The first low-indium layer 3 preferable has an indium content that is lower than the subsequent low-indium layers 5,7.

Although five (In,Ga)N layers are shown in FIG. 1, an (In,Ga)N layer structure could have fewer or more than five (In,Ga)N layers. In principle an (In,Ga)N layer structure could consist of only the first and second (In,Ga)N layers 3,4.

A method for the MBE growth of the (In,Ga)N layer structure of FIG. 1 will now be described.

Initially, a suitable substrate 2 is prepared and cleaned in any conventional manner, and is then introduced into the growth chamber of a suitable MBE apparatus. The substrate could be a bulk substrate, of GaN or $Al_yGa_{1-y}N$ (0<y<1). The substrate could alternatively consist of an epitaxial layer of GaN disposed on a base substrate of, for example, sapphire, SiC, Si, ZnO, or MgO.

The substrate is initially heated up to a pre-determined growth temperature. According to the present invention, this growth temperature is at least 650° C. Growth temperatures greater than 650° C. can be used, and the higher the growth temperature at which a layer is grown the higher will be the quality of the layer. As will explained below, the substrate temperature Is preferably below 800° C. for growth of an InGaN layer.

GaN tends to decompose when it is heated to a temperature of around 800° C. or higher. This decomposition can be prevented by supplying an over pressure of nitrogen gas, or ammonia gas to the surface of the GaN. If the substrate being used is a GaN substrate, or an epitaxial layer of GaN disposed on a base substrate, it is therefore preferable to supply ammonia gas to the growth chamber while the substrate temperature is being increased, in order to prevent thermal decomposition of the substrate. In principle, the ammonia gas does not need to be supplied at substrate temperatures substantially below 800° C., but it is more convenient to supply the ammonia gas for the entire duration of the heating step.

The rate at which the temperature of the substrate is increased to the desired growth temperature should not be so great that an uneven temperature distribution might occur in the substrate, since this would set up thermal stresses in the substrate. A temperature ramp rate in the range of 10–120° C. per minute has been found to be suitable.

In the (In,Ga)N layer structure shown in FIG. 1, the first layer 3 to be grown on the substrate 2 is a GaN layer or a InGaN layer having a low indium content. A suitable growth temperature for growing such a layer is in the range 650° C. to 1,000° C. The temperature of the substrate is therefore raised to a temperature in this range before the growth of the first (In,Ga)N layer 3 is started.

In order to grow a layer of InGaN by MBE, it is necessary to supply nitrogen, gallium and indium to the growth chamber, In the invention, the nitrogen required for the growth process is provided by supplying ammonia gas to the growth chamber. Thus, once the substrate has reached the desired temperature for the growth of the first layer of the InGaN multiple quantum well structure, the supply of ammonia gas to the growth temperature is started (if the supply of ammonia gas has not been started previously, for example as the substrate was being heated to the desired growth temperature). According to the invention, the supply of ammonia gas to the growth chamber is maintained continuously throughout the growth of the InGaN quantum well structure.

Once the substrate has reached the desired temperature for the growth of the first (In,Ga)N layer 3, it is preferably maintained at this temperature for up to 30 minutes to bake the substrate and thereby remove contaminants from the substrate.

At the end of the baking step (or, if there is no baking step, once the temperature of the substrate 2 has reached a suitable temperature for the growth of the first (In,Ga)N layer 3), the supply of gallium to the growth chamber is then started. This is shown as occurring at time to in FIG. 2(a). Both gallium and nitrogen are now being supplied to the growth chamber and, as a result, a layer 3 of GaN will be grown by MBE on the substrate 2. Growth of the GaN layer 3 is maintained until the layer 3 has reached a desired thickness.

Figure 2C:
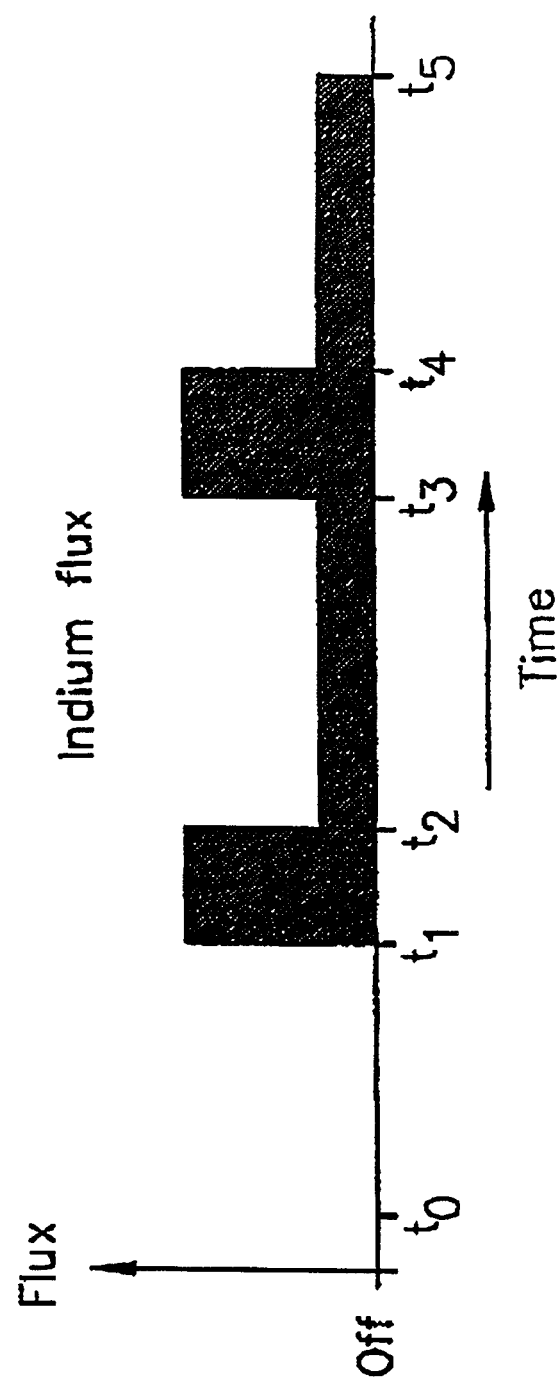
FIG. 2(c) is a schematic illustration of the flow rate of indium according to another embodiment of the present invention.

After a growth period corresponding to the time required for the layer 3 to grow to its desired thickness, the supply of indium to the growth chamber is then started at time $t_1$, as shown in FIG. 2(b). Indium, gallium and nitrogen are now being supplied to the growth chamber, and the result is the epitaxial growth of an InGaN layer 4 over the GaN layer 3. This phase of the growth process is maintained for the time required for the InGaN layer 4 to grow to its desired thickness.

The indium flux during the growth of the InGaN layer 4 is selected to obtain the desired Indium mole fraction for the layer. For example, if the desired indium mole fraction is 0.2 (i.e., the layer 4 is a layer of $In_{0.2}Ga_{0.8}N$) the indium flux supplied to the growth chamber between time $t_1$ and $t_2$ would be selected appropriately.

Once the InGaN layer 4 has grown to its desired thickness, the supply of indium to the growth chamber is cut off at time $t_2$. The supply of nitrogen and gallium are maintained, so that a further GaN layer 5 is grown on the InGaN layer 4.

The supply of indium during the subsequent growth process is then turned on at time $t_3$, to grow the second indium-rich InGaN layer 6. After the time required for the InGaN layer 6 to grow to its desired thickness the supply of indium is subsequently turned off at time $t_4$, and the GaN layer 7 is then grown. Finally, once the growth of the GaN layer 7 is complete, the supply of gallium is turned off at time $t_5$.

It will be seen from FIGS. 2(*a*) and 2(*b*) that the gallium flux is held at a substantially constant value over the entire duration of the growth of the (In,Ga)N quantum well structure 1. The composition of the layer being grown is varied by varying the indium flux. In this embodiment, the indium flux is simply varied between zero ("OFF") and a pre-set value ("ON"), so that a sequence of alternating GaN and InGaN layers is grown. Maintaining the gallium flux constant over the growth the (In,Ga)N quantum well structure 1 has the advantage that the growth rate is also kept constant, since the growth rate of an (In,Ga)N layer is, at low rates of supply of indium, determined primarily by the rate of supply of gallium. Maintaining a substantially constant supply rate of gallium throughout the growth process therefore ensures that each layer of the quantum well structure 1 is grown at the same growth rate, and this improves the growth quality of the quantum well structure 1.

In the embodiment of FIGS. 2(*a*) and 2(*b*) the first, third and fifth (In,Ga)N layers 3, 5, 7 are GaN layers. In alternative embodiments it is possible for any one, or more, of these layers to be InGaN layers, with a lower indium mole fraction than the second and fourth InGaN layers 4, 6.

FIG. 2(*c*) is a schematic illustration of the indium flux in another embodiment of the invention. In this embodiment it is desired for the third layer 5 and fifth layer 7 to be InGaN layers, but with a lower indium content than the second and fourth layers 4, 6. (The first layer 2 is again a GaN layer in this embodiment.) Thus, in these embodiments the indium flux for the growth of the third and fifth layers is set to a non-zero value that is lower than the indium flux used for the growth of the second and fourth layers. Thus, the indium flux is reduced at times $t_2$ and $t_4$, and is not switched off completely.

The indium flux during the growth of the InGaN layers 5, 7 is selected to obtain the desired indium mole fraction for the layer. For example, if the desired indium mole fraction is 0.05 (i.e., each of the layers 5, 7 is a layer of $In_{0.05}Ga_{0.95}N$) the indium flux supplied to the growth chamber between $t_2$ and $t_3$ and between $t_4$ and $t_5$ would be selected appropriately.

If desired, the first (In,Ga)N layer 3 may also be grown as an InGaN layer having a lower indium mole fraction than the second and fourth (In,Ga)N layers 4, 6. This can be done by supplying a non-zero indium flux to the growth chamber 5 during the time period from $t_0$ to $t_1$.

In the embodiments described above, the GaN and InGaN layers are not intentionally doped during the growth process. It is, however, possible to dope a GaN layer or an InGaN layer by introducing a suitable dopant during the MBE growth process, in a manner which is well known perse. Suitable dopants include silicon, tin, germanium, magnesium, calcium, carbon and beryllium. In the case of a GaN layer, indium may also be used as a dopant.

Once an InGaN multiple quantum well structure has been grown by a molecular beam epitaxy method of the present invention, further semiconductor layers can be grown over the multiple quantum well structure so as to produce, for example, an (Al,Ga,In)N electronic or opto-electronic device. For example, an InGaN multiple quantum well structure layer grown by a method of the present invention can be used as the basis for a laser diode or light-emitting diode emitting light in the wavelength range 380–450 nm.

According to the present invention, the substrate temperature for the growth of the indium-rich layers 4, 6 is greater than 650° C. At high substrate temperatures during the growth process indium tends to desorb from a newly-grown InGaN layer, and it is necessary to increase the pressure in the growth chamber to prevent desorption of indium. For substrate temperatures significantly greater than 800° C. the pressure required in the growth chamber to prevent desorption of indium becomes so high that the growth conditions are closer to MOCVD growth conditions than to MBE growth conditions, and the growth process effectively ceases to be an MBE growth process. It is therefore preferable to use a substrate temperature below 800° C. for growth of the indium-rich layers.

The growth temperature for a GaN layer, or for an InGaN layer having a low indium mole fraction, can be higher than the growth temperature for a indium-rich InGaN layer. In principle, a substrate temperature of around 1000° C. could be used for a GaN layer or for an InGaN layer having a low indium mole fraction. It is, however, preferable to grow all the layers of the multiple quantum well structure at the same substrate temperature. This is because a change in the substrate temperature between the growth of two layers of the multiple quantum well structure would necessitate an interruption in the growth process while the substrate temperature was changed from the temperature used for one layer to the temperature to be used for the next layer. Such an interruption in the growth process might be detrimental to the quality of the multiple quantum well structure, and could well outweigh any advantages obtained by growing the GaN or low-indium InGaN layers at a higher growth temperature than the indium-rich InGaN layers.

Where the entire multiple quantum well structure is grown at a single growth temperature, the growth temperature is chosen to be at least 650° C., and preferably between 650° C. and around 800° C. for the reason explained above.

In the growth process, ammonia gas is supplied to the growth chamber continuously throughout the growth process. The ammonia is preferably supplied at a beam equivalent pressure in the range from $1 \times 10^{-4}$ mbar, and the beam equivalent pressure of the elemental gallium, or of the elemental gallium and indium, is preferably equal to or greater than $1 \times 10^{-8}$ mbar (where both indium and gallium are supplied, the combined value of the beam equivalent pressure of indium and the beam equivalent pressure of gallium is preferably equal to or greater than $1 \times 10^{-8}$ mbar). If the beam equivalent pressure of ammonia were below $1 \times 10^{-4}$ mbar or the beam equivalent pressure of indium or of indium and gallium were leas than $1 \times 10^{-8}$ mbar the growth rate would be very low, and high-quality growth of the layers could not be reliably obtained.

The ammonia is preferably supplied at a beam equivalent pressure equal to or lower than $2 \times 10^{-2}$ mbar, and the beam equivalent pressure of the elemental gallium, or of the elemental gallium and indium, is preferably lower than $1\times10^{-4}$ mbar. If the beam equivalent pressure of ammonia should be significantly greater than $2\times10^{-2}$ mbar, or the beam equivalent pressure of the elemental gallium, or of the elemental gallium and indium, should be significantly greater than $1\times10^{-4}$ mbar, the gas pressure required in the growth chamber would be so high that the growth conditions would be closer to MOCVD growth conditions than to MBE growth conditions, and the growth process would effectively no longer be an MBE growth process.

In one preferred embodiment the following parameters were used:

substrate temperature: 650–700° C.
V/III ratio: approximately 500:1
beam equivalent pressure of gallium.: $1\times10^{-7}$ to $3\times10^{-7}$ mbar
beam equivalent pressure of indium: $1\times10^{-7}$ to $3\times10^{-7}$ mbar
beam equivalent pressure of ammonia: approximately $1\times10^{-4}$ mbar.

In this embodiment the desired substrate temperature was chosen to be a temperature within the range 650° C. to 700° C., and was not intentionally varied over the entire duration of the growth of the layer structure. (It should be noted, however, that minor fluctuations in the substrate temperature may occur even if the substrate temperature is not intentionally varied.)

The beam equivalent pressure of gallium was chosen to be within the range $1\times10^{-7}$ to $3\times10^{-7}$ mbar, and was not intentionally varied over the entire duration of the growth of the layer structure so as to maintain a substantially constant growth rate.

The beam equivalent pressure of indium was varied so as to obtain the desired indium mole fraction of each layer. For a beam equivalent pressure of gallium within the range $1\times10^{-7}$ to $3\times10^{-7}$ mbar, the beam equivalent pressure of indium for an indium rich layer would be within the range $1\times10^{-7}$ to $3\times10^{-7}$ mbar.

Figure 3:
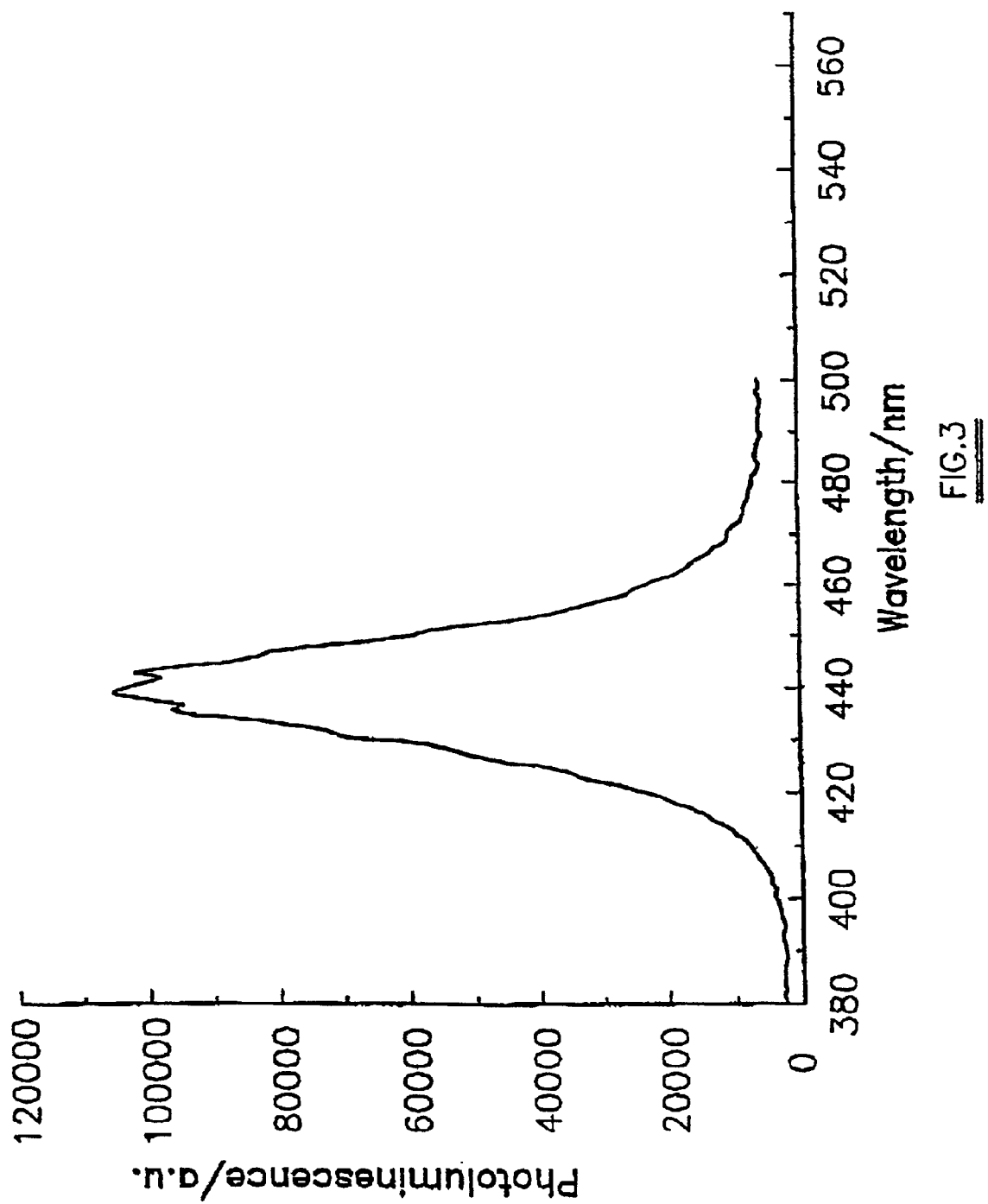
FIG. 3 shows a photo luminescence spectrum of a InGaN/GaN multiple quantum well structure grown according to a method of the present invention.

FIG. 3 is a photo-luminescence spectrum from a non-intentionally doped InGaN/GaN multiple quantum well structure of the type shown in FIG. 1 grown by a method of the invention. It can be seen that the spectrum is dominated by an intense, well-defined peak centred on a wavelength of approximately 440 nm. This is indicative of a high quality InGaN/GaN multiple quantum well.

Figure 4:
FIG. 4 is a cross-sectional transmission electron micrograph through a InGaN/GaN multiple quantum well structure grown according to a method of the present invention.

FIG. 4 is a cross-sectional transmission electron micrograph through an InGaN/GaN multiple quantum well structure grown by a method of the invention. It will be seen that the individual GaN and InGaN layers are well-defined, and are flat across the structure. This is also indicative of a high quality InGaN/GaN multiple quantum well.

The present invention requires a MBE growth apparatus that can achieve a V/III ratio of more than 10:1 during the growth process, and that can preferably achieve a V/III ratio of more than 500:1 during the growth process. The use of a high V/III ratio during the growth process of the present invention allows an InGaN nitride semiconductor layer to be grown at temperatures well above those used in prior art MBE methods. This leads to improved material quality. The MBE growth process of the present invention requires at least one thousand times less ammonia gas than does a conventional MOCVD process.

Such high V/III ratios can be achieved, for example, in a MBE growth apparatus in which ammonia gas is introduced into the growth chamber through a conduit whose outlet end is placed as close to the substrate as possible without radiative heat from the substrate causing excessive local heating of the outlet of the supply conduit. The elemental gallium and elemental indium introduced into the growth chamber using a conventional effusion cell. Further effusion cells can be used to supply aluminium and/or an elemental dopant for incorporation into the epitaxial growth material as necessary.

Figure 5:
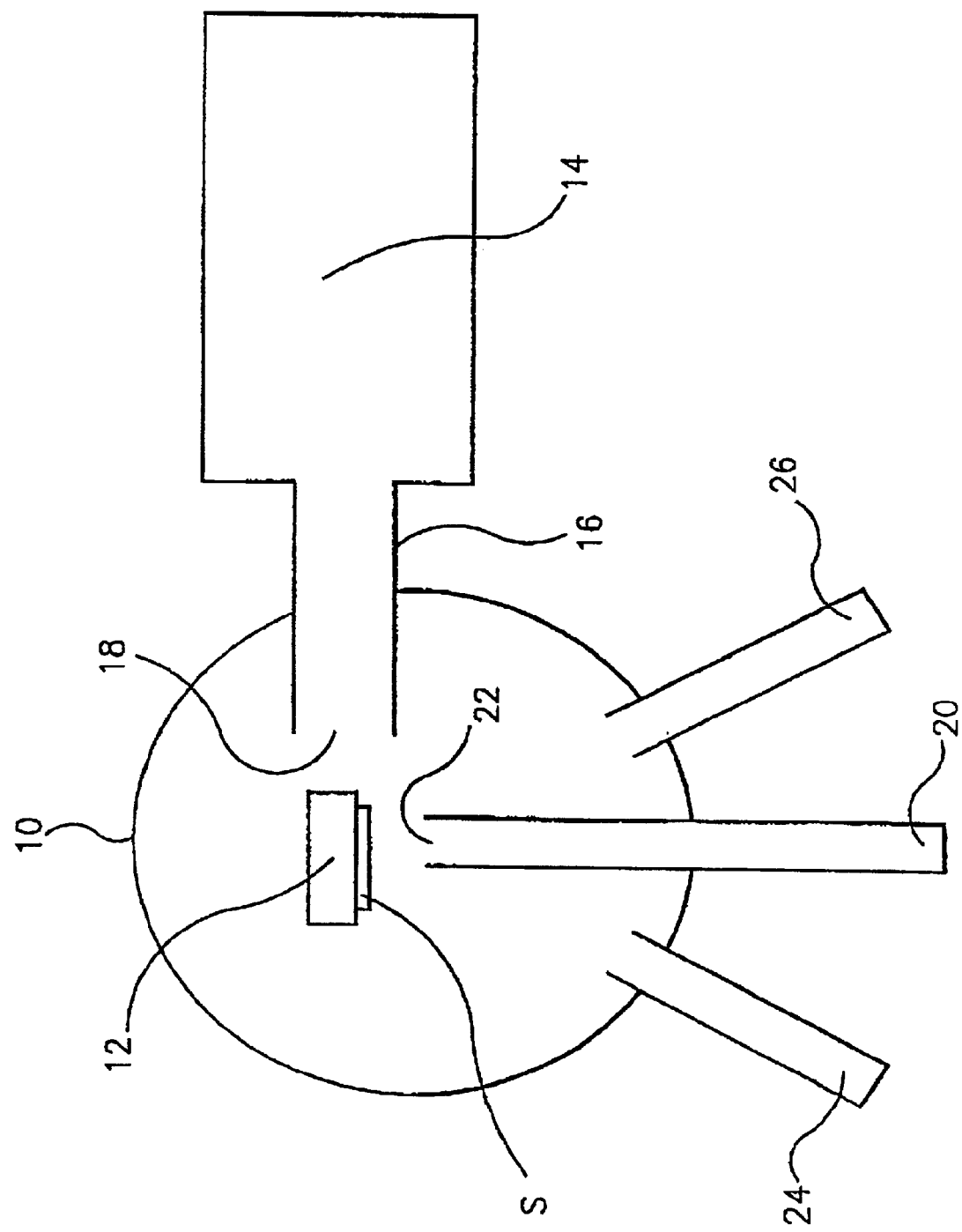
FIG. 5 is a schematic illustration of an apparatus suitable for carrying out a method of the present invention

FIG. 5 is a schematic view of an apparatus suitable for the growth of a nitride semiconductor material by molecular beam epitaxy according to a method of the present invention. The apparatus comprises a growth chamber 10 in which is disposed a heated support 12 arranged to support and heat a substrate S. The growth chamber 10 is connected with an ultra-high vacuum pump 14 via an exhaust conduit 16 which extends into the growth chamber 10. The inner end of the exhaust conduit 16 defines a vacuum outlet 18 of the growth chamber 10. The vacuum outlet 18 is disposed adjacent to the substrate support 12.

The growth chamber 10 is further provided with a first supply conduit 20 which extends into the growth chamber so that an outlet 22 of the first supply conduit 20 is adjacent to and faces the surface of the substrate S upon which epitaxial growth is to take place. The first supply conduit 20 can be adjustably mounted relative to the chamber so that the relatively small distance between the outlet 22 of the first supply conduit 20 and the epitaxial growth surface of the substrate S can be varied during the epitaxial growth process. The longitudinal axis of the first supply conduit 20 is substantially perpendicular to the plane of epitaxial growth.

The first supply conduit 20 is used to supply ammonia which is the precursor of the nitrogen required in the epitaxial growth process. Because the outlet 22 of the first supply conduit 20 is positioned relatively close to the substrate S, a relatively high ammonia vapour pressure is localised at the surface of the epitaxially growing material while still enabling an ultra-high vacuum environment within the growth chamber 10 to be achieved by the pump 14. The high ammonia vapour pressure enables a high V/III ratio to be realised during the growth process.

The apparatus further comprises independently operable, shutter-controlled effusion cells 24, 26 (two such cells are shown in FIG. 5) which contain sources of elemental gallium and for the epitaxial growth process. The effusion cells 24 and 26 are conventionally positioned and define second and further supply conduits respectively, Additional effusion cells may be provided to supply, for example, dopant species during the growth process AMBE apparatus of the type described above is described in European Patent Application No. 98301842.5, the contents of which are hereby incorporated by reference. It should be noted, however, that the present invention is not limited to a MBE apparatus of the type described in European Patent Application No. 98301842.5/0 864 672, but can be carried out in any MBE growth apparatus that can provide the required V/III ratio.

What is claimed is:

1. A method of growing an (In,Ga)N layer structure by molecular beam epitaxy comprising the steps of:
   a) disposing a substrate in a growth chamber;
   b) growing a first (In,Ga)N layer having a first indium mole fraction over the substrate at a substrate temperature of at least 650° C.; and
   c) varying the rate of supply of indium to the growth chamber thereby to grow a second (In,Ga)N layer having a second indium mole fraction different from the first indium mole fraction over the first (In,Ga)N layer at a substrate temperature of at least 650° C.;
      wherein the rates of supply of ammonia and gallium to the growth chamber are kept substantially constant during the growth of the first and second layers, and wherein at least one of the first (In,Ga)N layer and the second (In,Ga)N layer is an InGaN layer, and the substrate temperature during the growth of the at least one InGaN layer is in the range 650° to 800° C.

2. A method as claimed in claim 1 and comprising the further step of:
   d) varying the rate of supply of indium to the growth chamber thereby to grow a third (In,Ga)N layer having a third indium mole fraction different from the second indium mole fraction over the second layer at a substrate temperature of at least 650° C.

3. A method as claimed in claim 2 and comprising the further steps of:
   e) varying the rate of supply of indium to the growth chamber thereby to grow a fourth (InGaN) layer having the second indium mole fraction over the third layer at a substrate temperature of at least 650° C.; and
   f) varying the rate of supply of indium to the growth chamber thereby to grow a fifth (In,Ga)N layer having the third Indium mole fraction over the fourth layer at a substrate temperature of at least 650° C.

4. A method as claimed in claim 1 wherein the molecular ratio of the flow rate of ammonia to the growth chamber to the flow rate of indium and gallium to the growth chamber is selected to be at least 10:1.

5. A method as claimed in claim 4 wherein the molecular ratio of the flow rate of ammonia to the growth chamber to the flow rate of indium and gallium to the growth chamber is selected to be at least 500:1.

6. A method as claimed in claim 1 wherein the molecular ratio of the flow rate of ammonia to the growth chamber to the flow rate of indium and gallium to the growth chamber is selected to be less than 10,000:1.

7. A method as claimed in claim 1 wherein the beam equivalent pressure of ammonia supplied to the growth chamber is greater than $1 \times 10^{-4}$ mbar.

8. A method as claimed in claim 1 wherein the beam equivalent pressure of ammonia supplied to the growth chamber is equal to or less than $2 \times 10^{-2}$ mbar.

9. A method as claimed in claim 1 wherein the beam equivalent pressure of indium and gallium supplied to the growth chamber is equal to or greater than $1 \times 10^{-8}$ mbar.

10. A method as claimed in claim 1 wherein the beam equivalent pressure of indium and gallium supplied to the growth chamber is less than $1 \times 10^{-4}$ mbar.

11. A method as claimed in claim 1 wherein the second indium mole fraction is greater than the first indium mole fraction.

12. A method as claimed in claim 1 wherein the first indium mole fraction is zero whereby the first (In,Ga)N layer is a GaN layer.

13. A method as claimed in claim 2 wherein the third indium mole fraction is approximately 0.05.

14. A method as claimed in claim 1 wherein the second indium mole fraction is approximately 0.2.

15. A method as claimed in claim 1 wherein each layer is grown at substantially the same substrate temperature.

16. An (In,Ga)N layer structure grown by a method as defined in claim 1.

17. An (In,Ga)N laser diode comprising an (In,Ga)N layer structure as claimed in claim 16.

18. An (In,Ga)N light-emitting diode comprising an (In,Ga)N layer structure as claimed in claim 16.

* * * * *